United States Patent
Smith et al.

(10) Patent No.: US 8,305,126 B2
(45) Date of Patent: Nov. 6, 2012

(54) FLOP TYPE SELECTION FOR VERY LARGE SCALE INTEGRATED CIRCUITS

(75) Inventors: Alan P. Smith, Santa Clara, CA (US); Robert P. Masleid, Monte Sereno, CA (US); Georgios Konstadinidis, San Jose, CA (US)

(73) Assignee: Oracle International Corporation, Redwood City, CA (US)

( * ) Notice: Subject to any disclaimer, the term of this patent is extended or adjusted under 35 U.S.C. 154(b) by 112 days.

(21) Appl. No.: 13/005,835

(22) Filed: Jan. 13, 2011

(65) Prior Publication Data

US 2012/0182055 A1 Jul. 19, 2012

(51) Int. Cl.
*H03K 3/289* (2006.01)
*G01R 35/00* (2006.01)

(52) U.S. Cl. .......... 327/202; 327/213; 327/218; 326/93; 326/96; 702/79; 702/89; 716/100; 716/108; 716/113

(58) Field of Classification Search .................. 327/199, 327/202, 203, 208–214, 218; 326/93, 95–98; 702/79, 89; 716/100, 106, 108, 113
See application file for complete search history.

(56) References Cited

U.S. PATENT DOCUMENTS

| | | | |
|---|---|---|---|
| 5,742,190 A * | 4/1998 | Banik et al. .................. 327/152 |
| 5,801,955 A * | 9/1998 | Burgun et al. ................ 716/103 |
| 7,080,335 B2 * | 7/2006 | Behnen et al. ................ 716/108 |
| 7,346,861 B1 * | 3/2008 | Lee .............................. 716/103 |
| 7,634,749 B1 * | 12/2009 | Cortadella et al. ........... 716/100 |
| 2002/0047789 A1 | 4/2002 | Inada | |
| 2010/0301915 A1 * | 12/2010 | Hart et al. .................... 327/218 |
| 2010/0318945 A1 | 12/2010 | Koushanfar | |
| 2011/0006840 A1 | 1/2011 | Chen | |

* cited by examiner

*Primary Examiner* — Patrick O'Neill
(74) *Attorney, Agent, or Firm* — Meyertons Hood Kivlin Kowert & Goetzel; Erik A. Heter

(57) ABSTRACT

A method for determining flop circuit types includes performing a layout of an IC design including arranging master and slave latches of each of a plurality of flops to receive first and second clock signals, respectively. The initial IC design may then be implemented (e.g., on a silicon substrate). After implementation, the IC may be operated in first and second modes. In the first mode, the master latch of each flop is coupled to receive a first clock signal. In the second mode, the first clock signal is inhibited and the master latch is held transparent. The slave latch of each flop operates according to a second clock signal in both the first and second modes. The method further includes determining, for each flop, whether that flop is to operate as a master-slave flip-flop or as a pulse flop in a subsequent revision of the IC.

20 Claims, 12 Drawing Sheets

FLOP TYPE SELECTION FOR VERY LARGE SCALE INTEGRATED CIRCUITS

BACKGROUND

1. Field of the Invention

This invention relates to electronic circuits, and more particularly, to the selection of flop circuits in an integrated circuit design.

2. Description of the Related Art

Integrated circuits (ICs) may utilize a wide variety of different types of storage circuits. Commonly used storage circuits include master-slave flip-flops and latch circuits. Flip-flops and latches may be widely used to provide temporary storage of data states in an IC, e.g., for storing a state of a signal in transit between a first block of combinational logic and a second block of combinational logic.

Another type of storage circuit used in ICs is a pulse flop. A pulse flop may be formed by converting a single latch circuit to perform a flip-flop function using a pulse clock having a duty cycle of less than 50%. When the pulse clock is asserted (e.g., high), the pulse flop may be transparent, and thus a logic value on an input may be received and propagated to an output. When the pulse clock is not asserted (e.g., low), the logic value input may be blocked from propagating to the output, with the previously input logic value being stored.

The different operational characteristics of flip-flops and pulse flops may make them suitable for certain uses in an IC, but may also give rise to certain limitations. For example, while some pulse flop designs may be suitable for high-speed signal paths, they can also be subject to a race condition known as the min-time problem, wherein a signal may propagate through two or more serially coupled pulse flops when both are in their transparency phase (e.g., when the pulse is asserted). This can cause erroneous operation of the IC. Flip-flops are typically not subject to this condition since the master and slave portions may be transparent during different phases of the clock signal. However, flip-flops are typically not as fast as pulse flops.

During the design of an IC, many different simulations may be performed to determine where flip-flops, pulse flops, and latches should be implemented. Based on the simulations, the selected circuits may be placed at corresponding locations in the IC layout. The IC may be subsequently be implemented in silicon and tested. During the testing of the IC design, it is possible that some of the selected flip-flops and/or pulse flops may fail due to various reasons. This may necessitate a redesign of the IC, which may include changing its layout. However, such a redesign/layout change, particularly after the original design has been implemented in silicon, can be expensive and time consuming, and can further impact time to market. To prevent such an occurrence, a more conservative design approach may be taken. However, such an approach may sacrifice performance.

SUMMARY OF THE DISCLOSURE

A method for determining flop types for an integrated circuit (IC) on an individual, flop-by-flop basis is disclosed. In one embodiment, the method includes operating a plurality of flop circuits of an IC in a first mode and in a second mode. Each of the plurality of flop circuits includes master and slave latches. In the first mode, the master latch of each of the plurality of flop circuits receives a first clock signal while the slave latch of each of the plurality of flop circuits receives a second clock signal. The clock signals may be aligned such that the master and slave latches are not concurrently transparent. In the second mode, the slave latch receives the second clock signal while the first clock signal is inhibited such that the master latch remains transparent. Based on the results of operating in the first and second modes, it may be determined which of the plurality of flop circuits are to operate as master-slave flip-flops in a subsequent revision of the IC, and which are to operate as pulse flops.

In one embodiment, a method includes performing a layout of an IC design, which includes arranging master and slave latches of each of a plurality of flops to receive first and second clock signals, respectively. The initial IC design may then be implemented (e.g., on a silicon substrate). After implementation, the IC may be operated in first and second modes. In the first mode, the master latch of each flop is coupled to receive a first clock signal. In the second mode, the first clock signal is inhibited and the master latch is held transparent. The slave latch of each flop operates according to a second clock signal in both the first and second modes. The method further includes determining, for each flop, whether that flop is to operate as a master-slave flip-flop or as a pulse flop in a subsequent revision of the IC.

An IC is also disclosed. In one embodiment, the IC includes a clock unit configured to convey a first clock signal on a first signal path and a second clock signal on a second signal path. A master latch of each of a plurality of flop circuits is coupled to receive the first clock signal, while a slave latch of each flop circuit is coupled to receive the second clock signal. Each of the flop circuits is configured to operate as a master-slave flip-flop during a first mode of operation. During a second mode of operation, the master latch of each flop circuit is held transparent, and each flop circuit thus operates as a pulse flop.

BRIEF DESCRIPTION OF THE DRAWINGS

Other aspects of the invention will become apparent upon reading the following detailed description and upon reference to the accompanying drawings in which.

Figure 1:
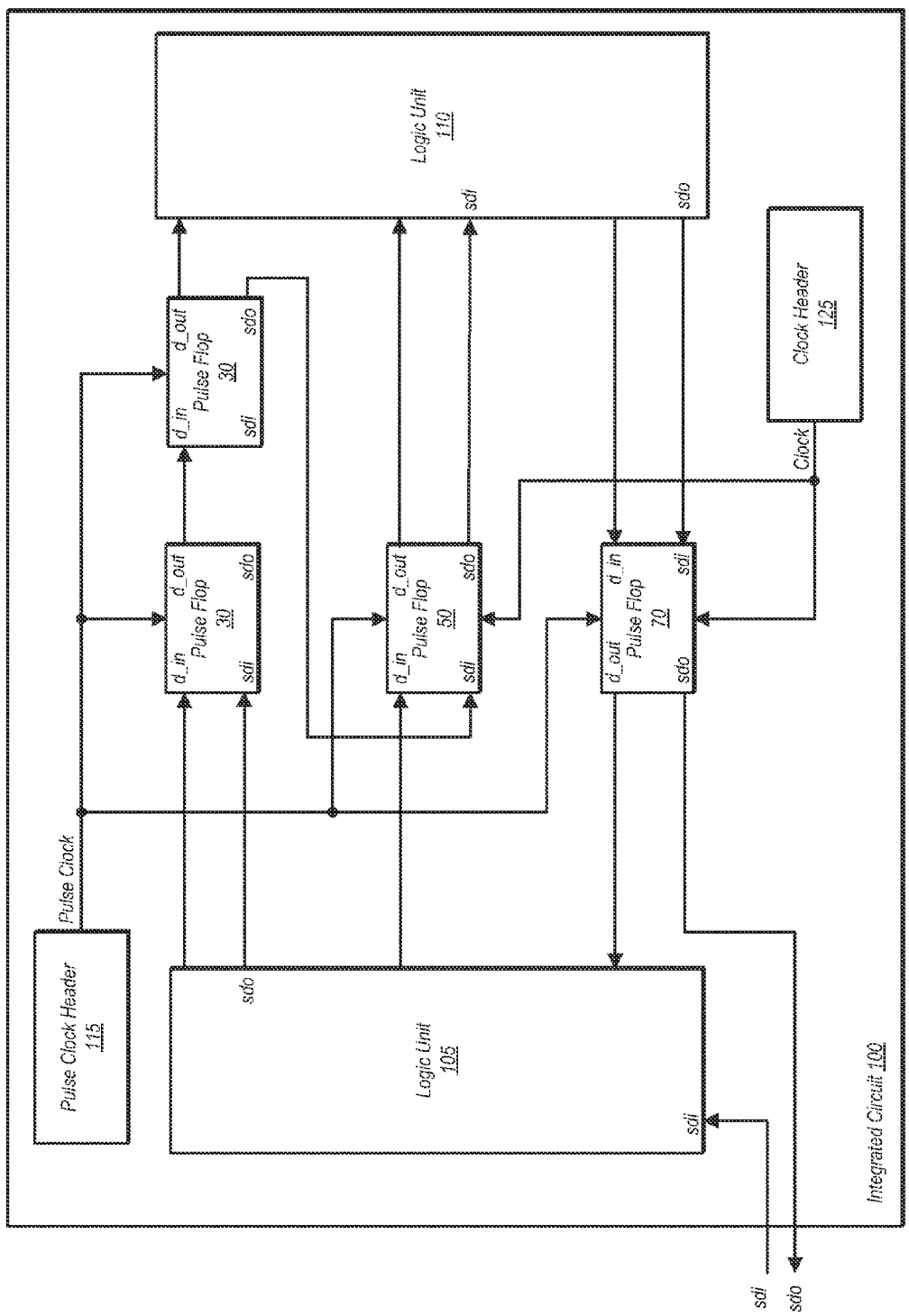
FIG. 1 is a block diagram of one embodiment of an integrated circuit (IC)

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

Overview:

The present disclosure is directed to a method of determining flop types (e.g., master-slave flip-flop or pulse flop) for certain flop circuits in an integrated circuit (IC) design. As used herein, the term flop circuit (or flop) may refer to one of several different types of storage circuits, including master-slave flip-flops, pulse flops, and latches that are otherwise not part of the former two circuits.

While some flop circuits in an IC design may be designated as master-slave flip-flops or pulse flops early in the design process, others are sometimes not easily designated as one or the other. As will be explained in further detail below, flops that are designated as non-critical may be implemented as master-slave flip-flops, while those designated as frequency limiters (or 'F-limiters') may be implemented as pulse flops. Flops of a third category, designated here as critical flops, are sometimes difficult to determine whether best implemented as a master-slave flip-flop or as a pulse flop. The present disclosure is directed to a method for determining whether these flops are best implemented as one or the other. The method may further be performed on an individual, flop-by-flop basis. That is, some critical flops may be designated as master-slave flip-flops, while others as pulse flops, with the determination made for each flop individually.

An apparatus to enable determining which flops are to be implemented as master-slave flip-flops and which are to be implemented as pulse flops is also disclosed. The arrangement may enable operation of an IC in a first mode and a second mode in order to determine which flop type is best for flops designated as critical. In the first mode, the flops designated as critical may operate as master-slave flip-flops. In the second mode, the master latch of the critical flops may be held in a transparent state such that they operate as pulse flops. After operating the IC in both the first and second modes, an analysis of its operation may be performed to determine the flop implementation for each of the critical flops in a subsequent revision.

FIGS. 1-8 and their corresponding descriptions of this disclosure are directed to various flop circuit types that may be used to implement the critical flops in an initial version of the IC. FIGS. 9-12 and their corresponding descriptions are directed to explaining the different categories of flop circuits and a method and apparatus for determining the flop types for the critical flops in a subsequent revision of the IC.

Integrated Circuit and Pulse Flop Block Diagrams:

Turning now to FIG. 1, a block diagram of one embodiment of an integrated circuit (IC) is shown. The block diagram of IC 100 is exemplary and is intended to illustrate certain aspects of the disclosure, but it is noted that it is not intended to be limiting. Thus, actual implementations of IC 100 may include components that are not explicitly shown or discussed herein.

IC 100 in the embodiment shown includes a first logic unit 105 and a second logic unit 110. Each of these logic units may include various combinational logic circuitry. Logic units 105 and 110 in the embodiment shown are coupled for communications with each other through various pulse flops. Using the pulse flops, the communications may be synchronized with respect to a pulse clock, a clock (e.g., a regular clock having a 50% duty cycle), or both. Various types of pulse flops may be used to facilitate such communications.

A first communications path from logic unit 105 to logic unit 110 is provided through a series of two pulse flops 30 in the embodiment shown. Each of pulse flops 30 in the embodiment shown is coupled to receive a pulse clock, but no other clock. The pulse clock may be generated and provided by pulse clock header 115. The pulse clock may be a clock that has less than a 50% duty cycle. Pulse flops 30 may each be transparent for the duty cycle (e.g., when the pulse is asserted high), but may otherwise block signal transmissions during the remainder of the cycle. As will be explained in further detail below, pulse flops 30 may be configured to prevent the min-time problem wherein the state of a signal might otherwise pass through two or more pulse flops when both are transparent (e.g., when the pulse is asserted in this example).

In the example shown, a second communications path from logic unit 105 to logic unit 110 is provided by pulse flop 50. A third communications path operable to convey signals from logic unit 110 to logic unit 105 is provided by pulse flop 70. Pulse flops 50 and 70 are each coupled to receive both the pulse clock and a 50% duty cycle clock signal ('Clock'). The 50% duty cycle clock signal may be generated and provided by clock header 125. In some embodiments, the clock signal provided to pulse flops 50 and 70 may be a complementary clock signal, i.e. one which has a 180° phase difference from the 50% duty cycle clock signal that is provided to other components. Pulse flops 50 and 70 may be synchronized in operation by both the pulse clock and the 50% duty cycle clock, or complement thereof, as will be discussed below.

In the embodiment shown, IC 100 is operable to support scan testing, including both a scan data input and a scan data output. A scan chain may be formed through logic units 105 and 110 and the various scan pulse flops. It is noted however that the circuitry to support scan testing is optional, and other embodiments are possible and contemplated wherein scan testing is not supported.

Figure 2:
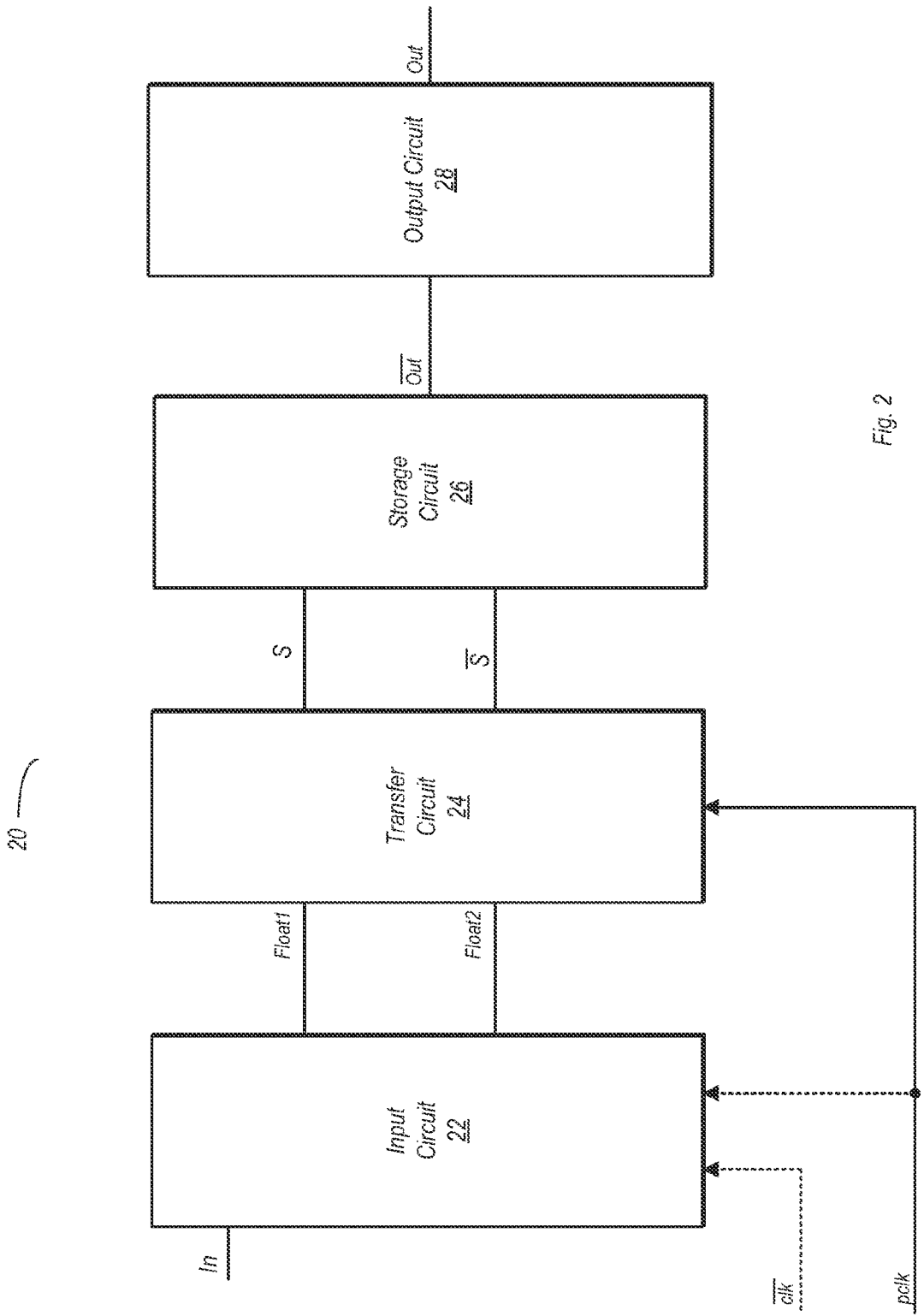
FIG. 2 is a block diagram of one embodiment of a pulse flop circuit.

FIG. 2 is a block diagram of one embodiment of a pulse flop. More particularly, pulse flop 20 in the embodiment shown may be used to illustrate the basic organization of pulse flops 30, 50, and 70 as introduced above and to be discussed further below.

Pulse flop 20 in the embodiment shown includes an input circuit 22, a transfer circuit 24, a storage circuit 26, and an output circuit 28. In some embodiments, input circuit 22, may be coupled to receive a complement of a clock signal, $\overline{clk}$, wherein the complement of the clock signal (like its true counterpart) has a 50% duty cycle. In other embodiments, input circuit may be coupled to receive a pulse clock signal, pclk, in which the duty cycle is less than 50%. Incoming data may be received by input circuit on the input node ('In').

Input circuit 22 in the embodiment shown is coupled to transfer circuit 24 via first and second float nodes, float1 and float2. These circuit nodes are labeled as such in this embodiment because at least one may "float" during at least a portion of the operational cycle of pulse flop 20. As used herein, the term "float" with respect to a node may refer to a time during the operation when the node is not being actively driven by either a PMOS (p-channel metal oxide semiconductor) or NMOS (n-channel metal oxide semiconductor) device. Similarly, a float node may be defined as a node that is not actively driven by any device for a portion of an operational cycle of the pulse flop. Accordingly, any voltage on that particular float node may be held capacitively for a time, although it is possible for the voltage to decay on the node if it is not actively driven after a certain time. However, since pulse flop 20 may be designed for fast operation, the amount of time necessary for a float node to hold a voltage may be relatively small, thereby enabling the activation of other devices dependent on receiving a voltage from that node. Furthermore, in implementing pulse flops using the float node, circuit area may be saved since extra transistors are not required to drive these nodes. This may also reduce delays through the circuit.

Transfer circuit 24 in the embodiment shown is coupled to receive the pulse clock signal, pclk. Responsive to a transition of the pulse clock to its active phase (e.g., from low to high), transfer circuit 24 may activate in order to transfer the logical value of the input signal, as well as its complement, to storage circuit 26. The complement of the input data may be conveyed on one of the float nodes (e.g., float1) while the true input data may be conveyed on the other one of the float nodes (e.g., float2).

Storage circuit 26 is configured to store the state of the input data signal and its complement, and may continue to store these values subsequent to deactivation of transfer circuit 24. Output circuit 28 in the embodiment shown is coupled to receive a complement of the output signal, $\overline{out}$, and is configured to drive the true output signal, out, on its output node. It is noted that in some embodiments the output signal may be a complement of the input signal.

Figure 3:
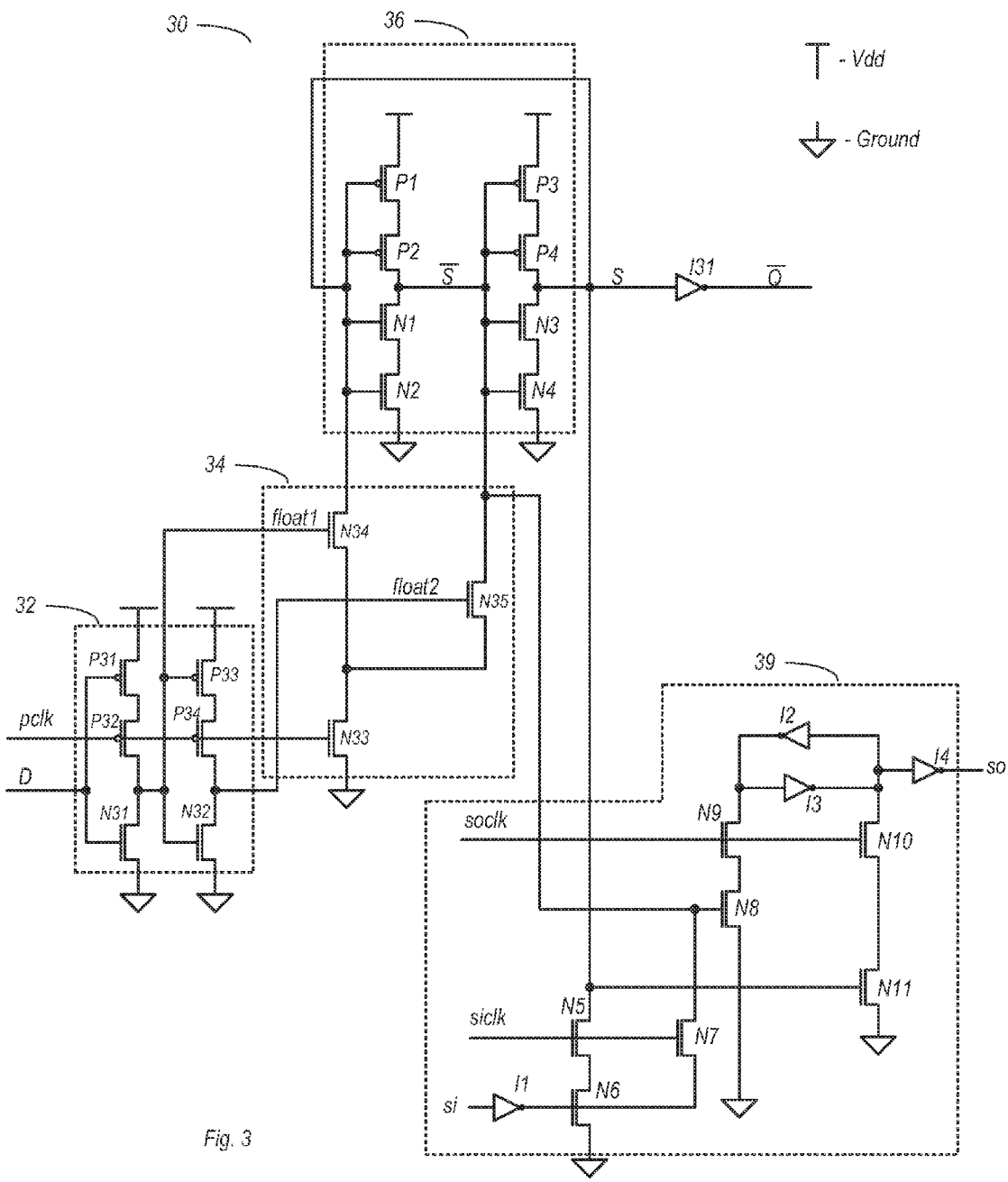
FIG. 3 is a schematic diagram of one embodiment of a pulse flop circuit.
Figure 4:
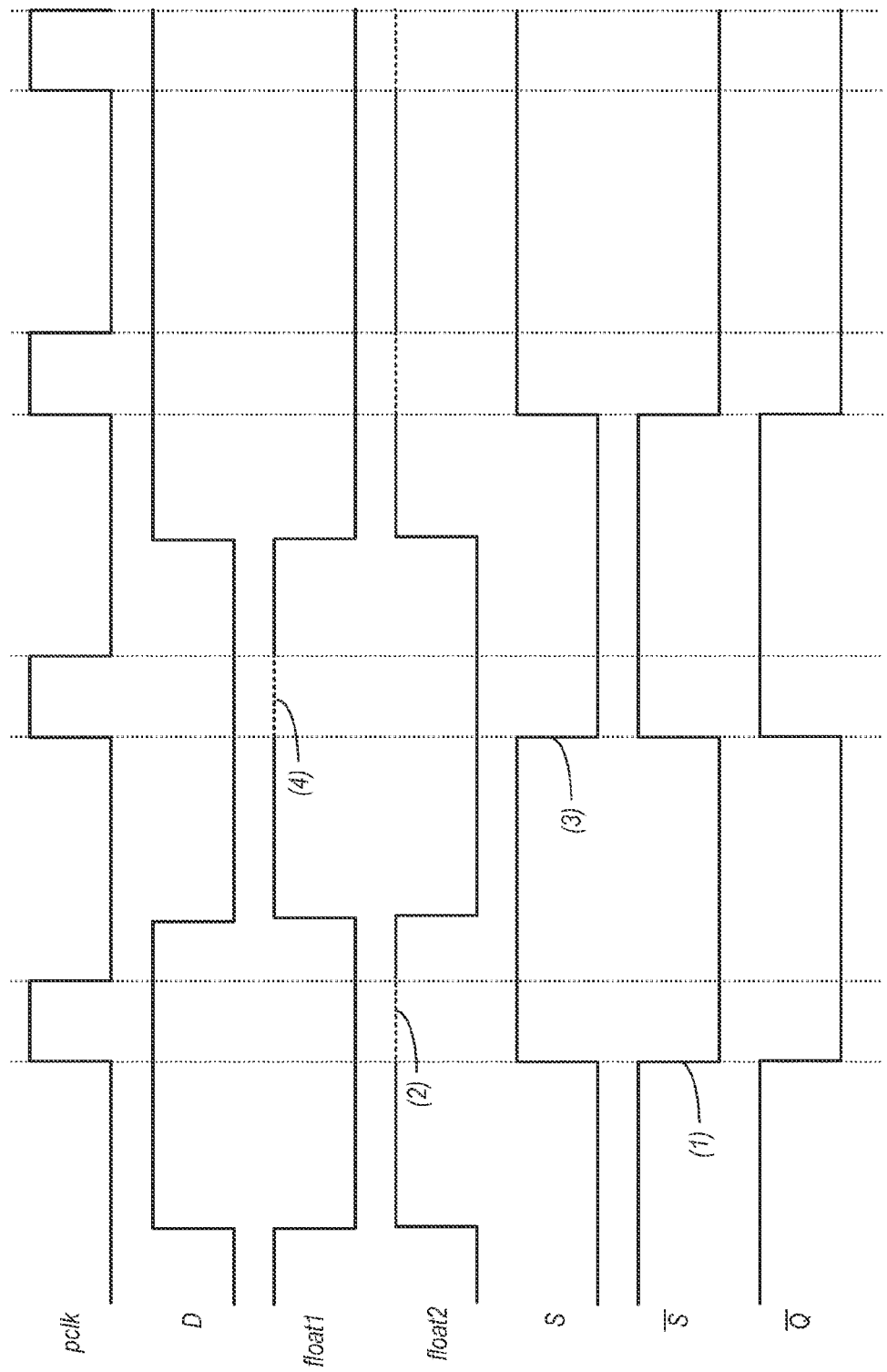
FIG. 4 is a timing diagram illustrating operation of the embodiment of the pulse flop circuit of FIG. 3.
Figure 5:
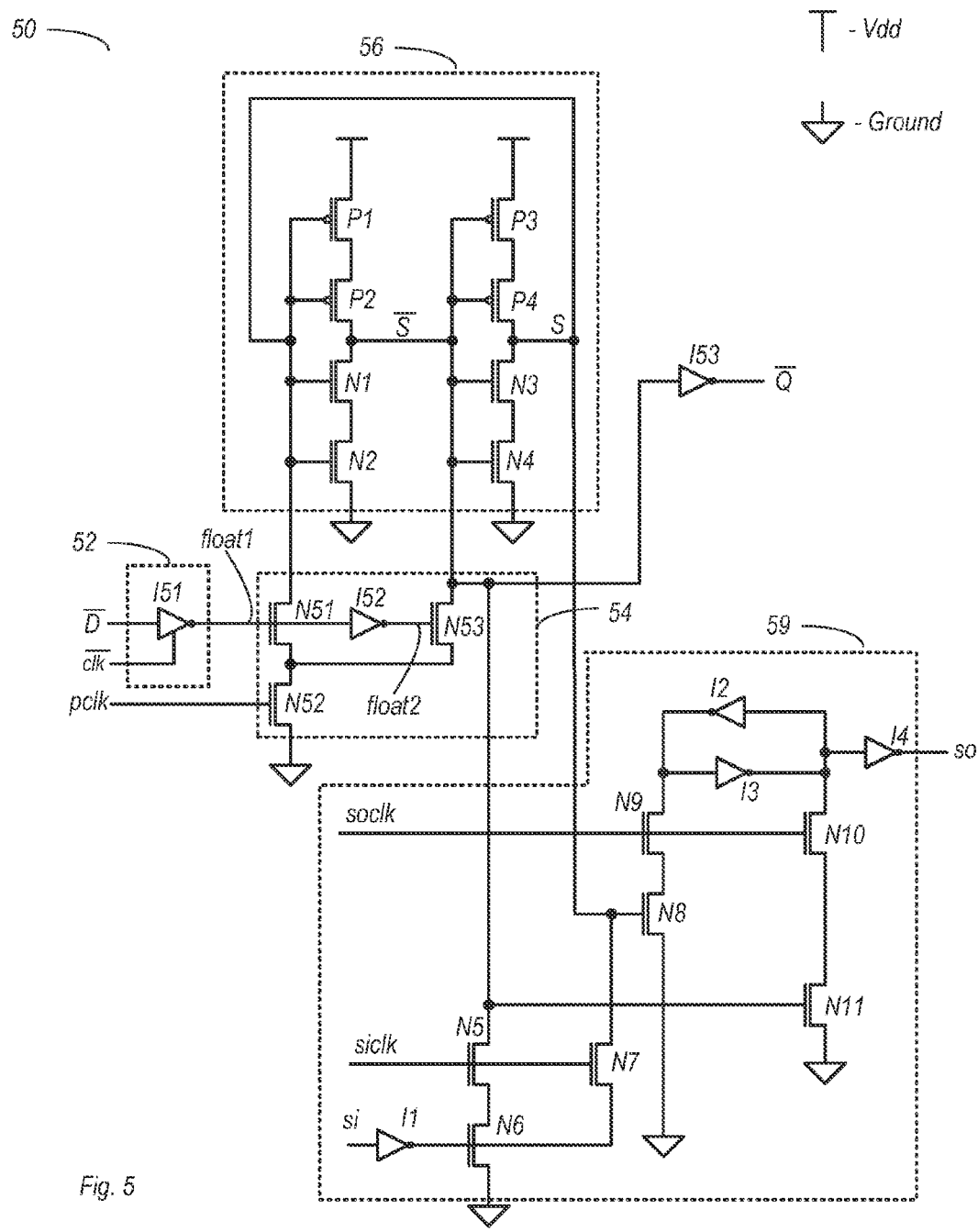
FIG. 5 is a schematic diagram of another embodiment of a pulse flop circuit.
Figure 6:
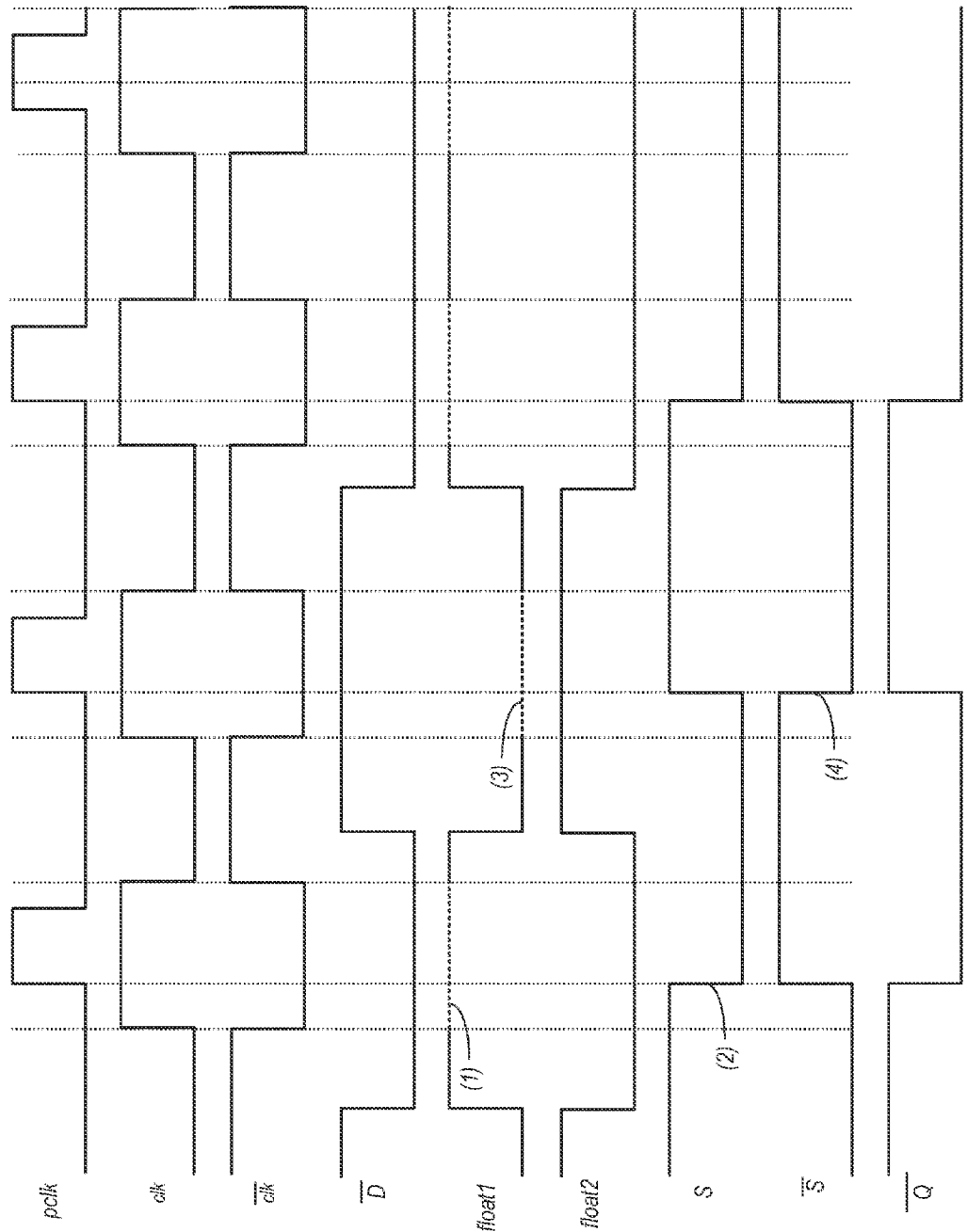
FIG. 6 is a timing diagram illustrating operation of the embodiment of the pulse flop circuit of FIG. 5.
Figure 7:
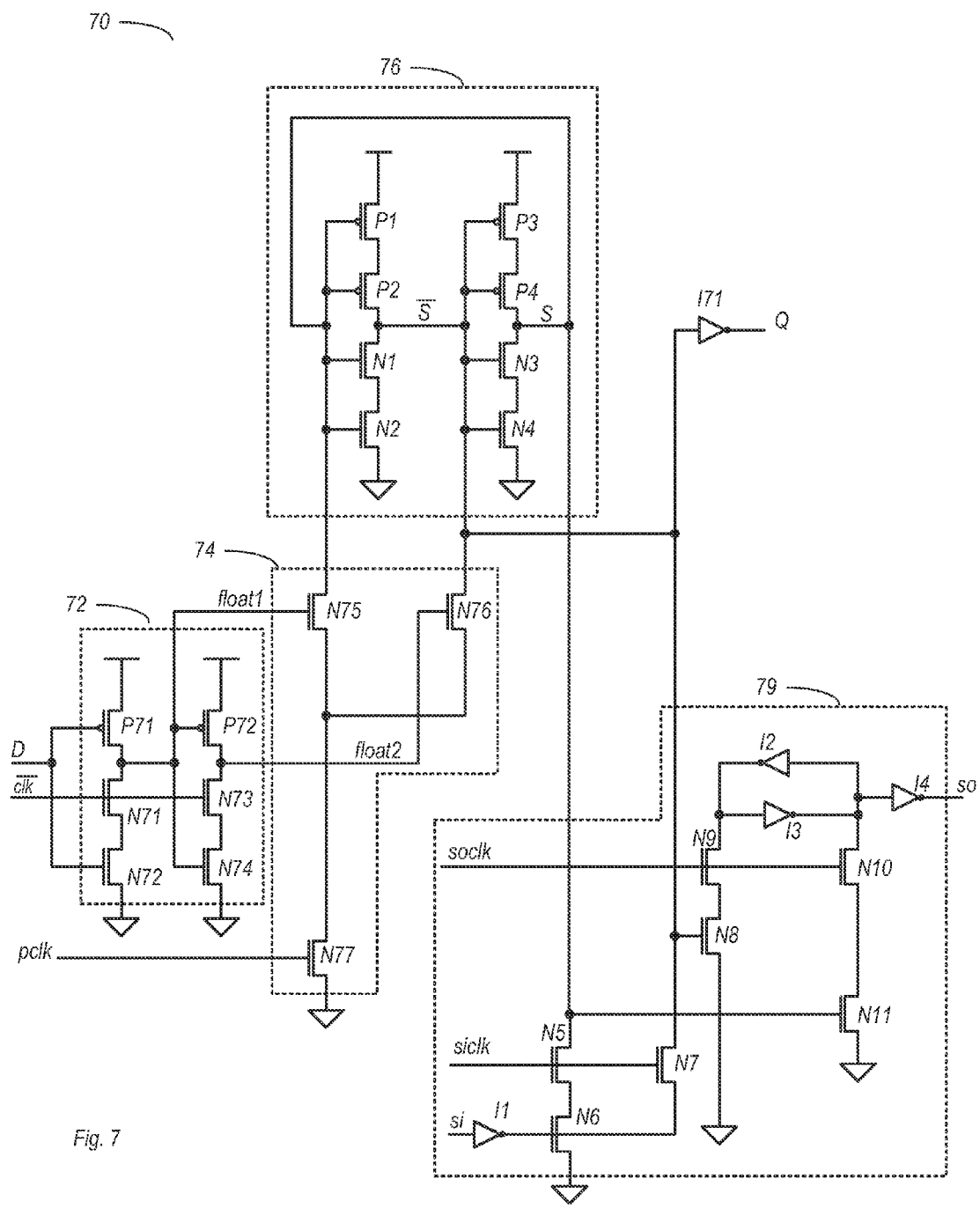
FIG. 7 is a schematic diagram of another embodiment of a pulse flop circuit.
Figure 8:
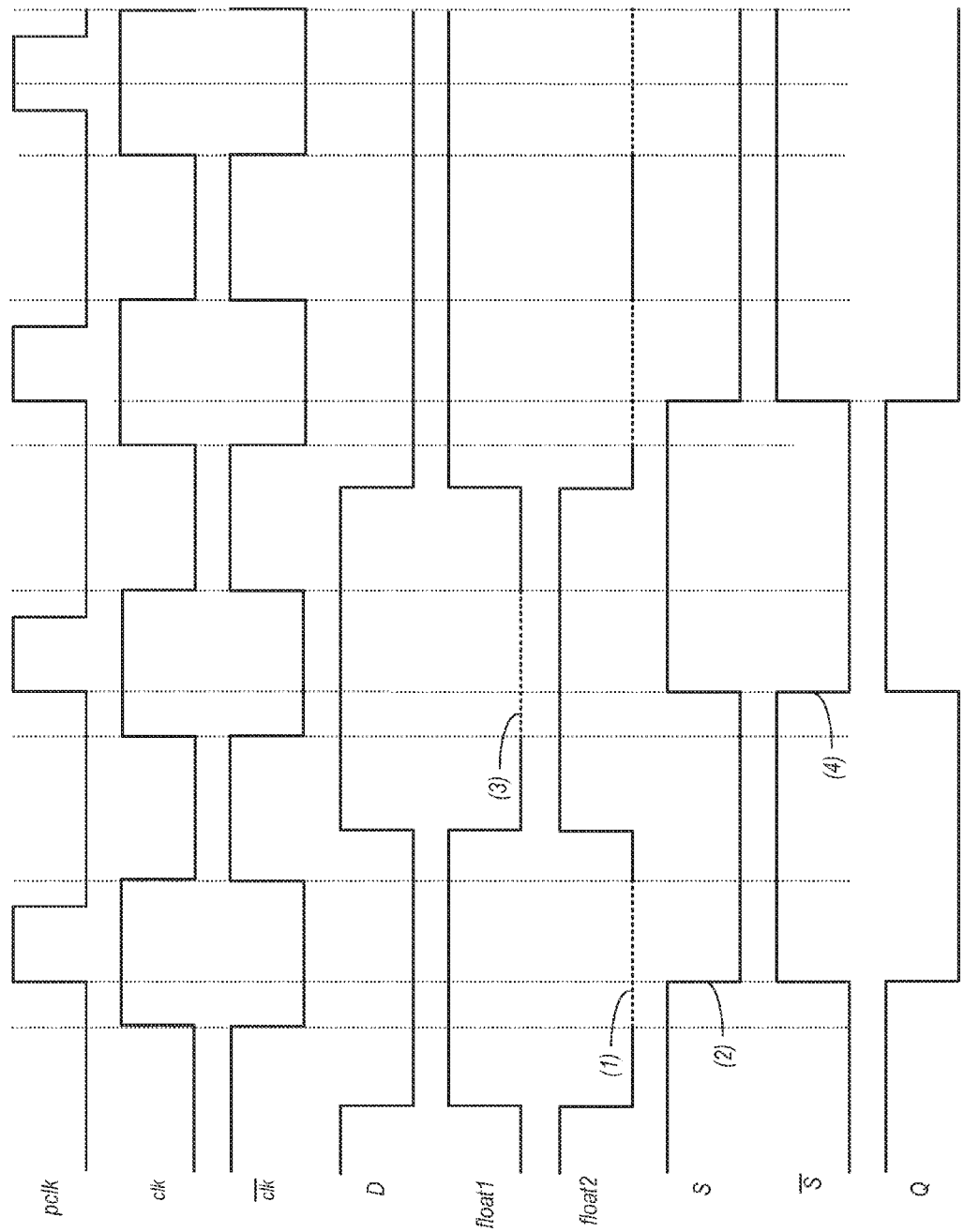
FIG. 8 is a timing diagram illustrating operation of the embodiment of the pulse flop circuit of FIG. 7.

Pulse Flop Circuit Embodiments and Operation:

FIGS. 3, 5, and 7 each illustrate a different embodiment of a pulse flop circuit. FIGS. 4, 6, and 8 each illustrate the timing relationships of FIGS. 3, 5, and 7, respectively. Each of the pulse flop circuits illustrated may operate in accordance with a pulse clock, and the latter two embodiments are configured to operate in accordance with a 50% duty cycle clock. Furthermore, each of the circuit embodiments to be discussed herein is configured to prevent the min-time problem. More particularly, each of the circuit embodiments to be discussed is arranged such that it is not fully transparent between its respective input and output nodes during operation, while still providing the functionality of a pulse flop. Accordingly, the various pulse flop embodiments discussed herein may be useful in applications requiring fast signal transmission (and thus, where a master-slave flip-flop would be unsuitable) while providing the ability to prevent the state of a signal to race through two or more series-coupled pulse flop circuits.

It is noted in the various circuit embodiments illustrated that transistors designated with a 'P' are PMOS transistors, while transistors designated with an 'N' are NMOS transistors. It is noted however that the arrangements of PMOS and NMOS transistors in these embodiments are exemplary, and thus other arrangements are possible and contemplated.

Turning now to FIG. 3, a schematic diagram of one embodiment of a pulse flop circuit is illustrated. Pulse flop 30 in the embodiment shown is configured to operate according to the pulse clock, pclk, but does not require a 50% duty cycle clock. In the embodiment shown, input circuit 32 and transfer circuit 33 are both coupled to receive the pulse clock, but function based on the opposite states thereof Input circuit 32 in the embodiment shown includes two series-coupled gated inverters. A first gated inverter is coupled to receive the data input, D, and includes transistors P31, P32, and N31. The second gate inverter includes P33, P34, and N32. Transistors P32 and P34 are arranged to provide a gating function for their respective inverters. When pclk is low, transistors P32 and P34 are active. Accordingly, when pclk is low, the first gated inverter may provide a complement of the input D, $\overline{D}$ on the first float node, float1, while the logical equivalent of D is provided on the second float node, float2.

When pclk transitions high, a pull-up path for at least one of the gate inverters will be blocked. For example, if D is low, float1 will be pulled high toward Vdd through P31 and P32 when pclk is low. However, when pclk transitions high, P32 is deactivated, and thus the pull-up path is blocked. Furthermore, since P32 is inactive when pclk is high and N31 is inactive when D is low, a high pclk with a low on D results in a situation where the first float node, float1, is not driven by any device and thus the voltage thereon is floating. A high voltage present on float1 at the time when pclk transitions high may be held capacitively for a time, and may be sufficient to cause the activation of N32 and N34 (the latter being part of transfer circuit 34). In one embodiment, the length of the active portion of the pulse clock (e.g., high in this case) may be timed such that float1 may hold a high voltage to activate N32 and N34 may remain active throughout.

A high on the D input when pclk is low may activate N31 and thus pull float1 low. The low on float1 may in turn activate P33, and thus float2 may be pulled high through P33 and P34. Float1 may remain driven after pclk transitions high, as the pull-down path remains through N31. However, when pclk transitions high, P34 is deactivated, thereby removing the pull-up path between float2 and Vdd. Accordingly, a floating voltage may be present on float2, and this voltage may be held capacitively for a time. However, as noted above, the pulse width may be selected as such to allow float2 to remain high long enough that N35 (of transfer circuit 34) is active throughout the active portion of the pulse.

As noted previously, transfer circuit 34 includes devices N34 and N35, and also includes N33. Depending on the input data received by input circuit 32 on node D, one of transistors N34 and N35 may be active at a given time. When pclk is low, N33 is inactive. However, when pclk transitions high in this embodiment, N33 is activated, thereby providing a pull-down path through itself and the active one of N34 and N35. If N34 is active concurrent with N33, node S of storage circuit 36 is pulled low through those devices. Node $\overline{S}$ is pulled low through N33 and N35 when those devices are concurrently active.

Storage circuit 36 in the embodiment shown includes a pair of cross-coupled inverters. The first of these inverters includes pull-up devices P1 and P2 along with pull-down devices N1 and N2. The second of these inverters includes pull-up devices P3 and P4 along with pull-down devices N3 and N4. The first of the inverters is coupled to node S as an input and is configured to drive an output on node $\overline{S}$. The second inverter is coupled to node $\overline{S}$ as an input, and is coupled to drive node S as an output.

It is noted that devices N33, and N34, and N35 of transfer circuit 34 are sized such that when either of the latter two is concurrently active with the former, the collective drive strength is sufficient to override either of the inverters of storage circuit 36. Thus when N33 and N34 are both active, the output of the second inverter, node S, may be pulled low even if the second inverter is attempting to drive node S high. This may thus cause the state of storage circuit 36 to flip, as the first inverter may respond by driving node $\overline{S}$ high, thus resulting in the second inverter switching to drive node S low. Similarly, when devices N33 and N35 are both active, the output node of the first inverter, $\overline{S}$, may be pulled low even when the first inverter is attempting to drive this node high. As a result, the second inverter may switch to begin driving node S high, thereby causing the first inverter to drive node $\overline{S}$ low.

In the embodiment shown, an output circuit is implemented using inverter I31. In this particular example, the input of I31 is coupled to node S, while the output provided on node $\overline{Q}$ is a complement of the input provided on node D. It is noted however that embodiments where the input node of I31 is coupled to node $\overline{S}$ (and thus a logical equivalent of the input is provided on the output) are possible and contemplated. Furthermore, embodiments having output circuits utilizing other arrangements (e.g., two inverters coupled in series) are also possible and contemplated.

FIG. 4 is a timing diagram illustrating operation of the embodiment of the pulse flop circuit of FIG. 3. In the given example, just prior to pclk transitioning high, the input node D is high, as is float2, while float1 is low. When pclk transitions high, N33 is activated. Device N35 is also active at the time pclk transitions high due to the high on float2 at the time of the transition. Thus, with N33 and N35 concurrently active, $\overline{S}$ is pulled low through these devices, at (1), with S correspondingly being pulled high. The output node, $\overline{Q}$, also follows $\overline{S}$ low, although this response may be slightly delayed (such a delay is not depicted here for the sake of simplicity).

As depicted by the dashed lines at (2), float2 may float subsequent to the low-to-high transition of pclk. When pclk transitions high, P34 is deactivated. Accordingly, the pull-up path to Vdd through P33 and P34 is cut off due to the deactivation of P34. With N32 also inactive at this point, float2 is not driven by any device. Accordingly, the high present on float2 just prior to the low-to-high transition of pclk is held capacitively. Pulse flop 30 may be designed such that the amount of time pclk is high is short enough in duration that float2 may hold the voltage at least for a duration sufficient to hold N35 active and thus pull $\overline{S}$ low. In some embodiments, the circuit may be designed such that the float2 may hold its voltage capacitively throughout the high portion of pclk. Float2 is again pulled high after pclk falls low, as P34 is once again active and the pull-up path through this device and P33 is restored.

It is also noted that when pclk is high, pulse flop 30 is not transparent. This is due to the resulting deactivation of P32 and P34. Thus, even if D were to fall low when pclk is high, the state of transfer circuit 34 would not change since the resulting deactivation of P32 would block the pull-up path between float1 and Vdd (through P31 and P32).

Subsequent to pclk falling low in this example, the data on node D also falls low due to new input data. When D falls low, N31 is deactivated and P31 is activated. With pclk low, float1 is pulled high through active devices P31 and P32. The high on float1 is received at the gate of N32, which is also activated and thus causes float2 to be pulled low. The high on float1 is also received at the gate terminal of N34. When pclk transitions high again, both N34 and N33 are concurrently active. Accordingly, node S is pulled low, at (3). Node $\overline{S}$ correspondingly is pulled high due to node S being pulled low.

As depicted by the dashed line at (4), float1 is not driven any device when pclk is high during this state. This is due to the deactivation of P32 when pclk is high, which blocks the pull-up path between float1 and Vdd. Since N31 is also inactive due to the low on input node D, float1 is not driven. The high on float1 just prior to the low-to-high transition may thus be held capacitively for a time that is sufficient to hold N34 active and thus pull node S low (if not for the entire duration of the high phase of pclk).

Returning to FIG. 3, pulse flop 30 in the embodiment shown includes a scan element 39, which may be used to enable scan testing of pulse flop 30, as well as other circuitry coupled to other scan elements. Scan element 39 may be one of a serially coupled chain of scan elements. Moreover, scan element 39 may be used to input test stimulus data to and capture test result data from storage element 36. Furthermore, scan data may be shifted through scan element 39 during scan shift operations in which test stimulus data is loaded or test result data is unloaded.

Scan element 39 includes a scan input (si) through which data is received during scan shift operations. The scan input data may be received by inverter I1, which may be implemented with a PMOS pull-up device and an NMOS pull-down device, each having gate terminals coupled to node si. Test stimulus data may be loaded into storage circuit 36 by scan element 39 when the scan input clock (siclk) is asserted, (and thus devices N5 and N7 are active).

If the scan input data is high, inverter I1 outputs a low, and N6 is inactive. Node $\overline{S}$ may be pulled low when both the scan input data and the scan input clock are high, through transistor N7 (which is active when the scan input clock is high) and the NMOS device of inverter I1.

If the scan input data is low, inverter I1 outputs a high. The high output from inverter I1 activates N6, while N5 is high when the scan input clock is high. Accordingly, node S is pulled low. Node $\overline{S}$ is pulled high in this situation through P1, P2, N1 and N2 of storage circuit 36.

Scan output data may be provided on node (so) when the scan clock (soclk) is high. If $\overline{S}$ is high concurrent with a high on the scan output clock node, both N8 and N9 are active, and scan data output node is driven low (via series coupled I3 and I4). If S is high concurrent with a high on the scan input clock node, devices N10 and N11 are concurrently active, and the scan data output node is driven high via inverter I4.

FIG. 5 is a schematic diagram of another embodiment of a pulse flop circuit. It is noted that in this embodiment, storage circuit 56 and scan element 59 are arranged in a manner similar to their counterparts shown in FIG. 3, and thus are not discussed in further detail. Furthermore, pulse flop 50 in the embodiment shown implements an output circuit using inverter I53. It is noted however that other output circuit embodiments are possible and contemplated, such as those alternate embodiments discussed above with reference to pulse flop 30.

In the embodiment shown in FIG. 5, pulse flop 50 includes an input circuit 52 having an input node $\overline{D}$ and further coupled to receive a complementary clock signal, $\overline{clk}$. The complementary clock signal $\overline{clk}$ may be a 50% duty cycle signal that is of opposite phase of a clock signal that is distributed to other circuitry in an IC in which pulse flop 50 is implemented.

Both the input D and complementary clock signal $\overline{clk}$ are received by a gated inverter I51 in the embodiment shown. Although not explicitly shown here, gated inverter I51 may include at least one PMOS pull-up device, and at least one NMOS pull-down device, each having respective gate terminals coupled to $\overline{D}$, with one or more additional gating devices having respective gate terminals to $\overline{clk}$. Thus, when $\overline{clk}$ is high, inverter I51 may drive float1 according to the logic level of an input signal received on $\overline{D}$. When $\overline{clk}$ is low, I51 may inhibit a change of state on float1 even if a change occurs on $\overline{D}$.

Transfer circuit 54 in the embodiment shown includes devices N51, N52, and N53, along with inverter I52 (which may be a standard inverter including a PMOS pull-up device and an NMOS pull-down device). Float1 is coupled to the gate terminal of N51 and the input of I52, while the output of I52 is coupled to the gate terminal of N53. The gate terminal of N52 is coupled to pclk, and is thus active when the pulse clock is high. Transfer circuit 54 may transfer a logic state received by input circuit 52 by providing a pull-down path for node S (through N51 and N52) or for node $\overline{S}$ (through N53 and N52).

The operation of pulse flop 50 is further illustrated by the timing diagram of FIG. 6. When $\overline{clk}$ is high, a high-to-low transition on $\overline{D}$ results in float1 transitioning high, and float2 falling low responsive thereto. When the clock signal (clk)

transitions high, and thus $\overline{clk}$ falls low, float1 ceases to be driven by inverter I51, as depicted by the dashed lines at (1). The high on float1 may be held capacitively once it is no longer driven by I51 in a manner similar to that described above for the float nodes of pulse flop 30. At a time subsequent to $\overline{clk}$ falling low, pclk transitions high. Due to the low-to-high transition of pclk, both N51 and N52 are concurrently active at this time, and thus node S is pulled low at (2), with $\overline{S}$ being driven high as a result thereof. Float1 continues to float until $\overline{clk}$ transitions high again.

At a point subsequent to $\overline{clk}$ transitioning high, the input signal on $\overline{D}$ transitions high in the example shown. Accordingly, float1 falls low while float2 is driven high by I52. When $\overline{clk}$ subsequently falls low again, float1 is again no longer driven by any device, and thus floats low at (3). However, the output of inverter I52 may remain high as long as the voltage on float1 remains sufficiently low. The subsequent low-to-high transition of pclk results in the activation of N52. Thus, with N53 and N52 concurrently active, $\overline{S}$ is pulled low through these devices, at (4), with S being driven high responsive to the state change of $\overline{S}$.

FIG. 7 is a schematic diagram of another embodiment of a pulse flop circuit. Transfer circuit 74, storage circuit 76, and scan element 79 of pulse flop 70 are arranged in a manner similar to their counterparts of pulse flop 30 shown in FIG. 3, and may thus operate in a similar manner.

Input circuit 72 in the embodiment shown, includes two gated inverters coupled in series. The first of these inverters includes devices P71, N71, and N72. The second of these inverters includes P72, N73, and N74. The gate terminals of devices N71 and N73 are each coupled to node $\overline{clk}$, and may thus enable or block a pull-down path for their respective inverters. The operation of pulse flop 70 will now be explained in with reference to the timing diagram in FIG. 8.

The timing diagram shown in FIG. 8 begins with a high on node D, which subsequently falls low. Node $\overline{clk}$ is high at this point, and thus N71 and N73 are both active. As a result of D falling low, P71 is activated and thus float1 is pulled high. The high on float1 is received by the gate terminal of N74, which activates. Thus, float2 is pulled low.

When $\overline{clk}$ falls low, both N71 and N73 are deactivated. Float1 remains pulled high at this point, as the pull-up path through P71 is not blocked. However, the pull-down path from float2 to ground is blocked when N73 is deactivated. Since P72 is also inactive at this point, float2 is not driven by any device, and thus floats low, as depicted by the dashed lines at (1). When pclk subsequently rises, node S is pulled low through concurrently active devices N75 and N77 at (2). Node $\overline{S}$ is pulled high at this point as a result of node S being pulled low. After $\overline{clk}$ transitions high again, the pull-down path though N73 and N74 is restored, and float2 is again driven low.

In the example shown, D transitions high subsequent to pclk falling low and $\overline{clk}$ transitioning high again. When $\overline{clk}$ falls low again, the pull down path between float1 and ground is blocked by the deactivation of N71. Since P71 is also inactive (due to the high on D), float1 is thus not driven by any device at this point, and thus floats low as shown at (3). Float2 may remain high if the voltage on float1 remains sufficiently low to ensure that P72 remains active. Accordingly, the high on float2 may activate N76. When pclk subsequently transitions high, N77 is activated. Accordingly, $\overline{S}$ is pulled low through N76 and N77 at (4), with S being driven high as a result thereof.

Flop Selection for Integrated Circuits:

FIGS. 9-12 are directed to a method and apparatus for determining flop types for particular flops in an IC. During the design of an IC, it is important to know which flop circuits are to operate as master-slave flip-flops, and which are to operate as pulse flops. Various factors may be used to make such a determination. These factors may include delay time through flop circuits, delay time between flop circuits, the effect of the min-time problem discussed above, and desired operating frequency.

For certain flop circuits, it may be difficult if not impossible to determine the best or correct flop type choice until late in the design process. By this time, the floorplan of the IC may be largely determined. Changing the floorplan of an IC late in the design process may result in significant extra costs, additional time to market, or both. Accordingly, it is desirable that the selection of flop types not impact the floorplan of the IC.

Figure 9:
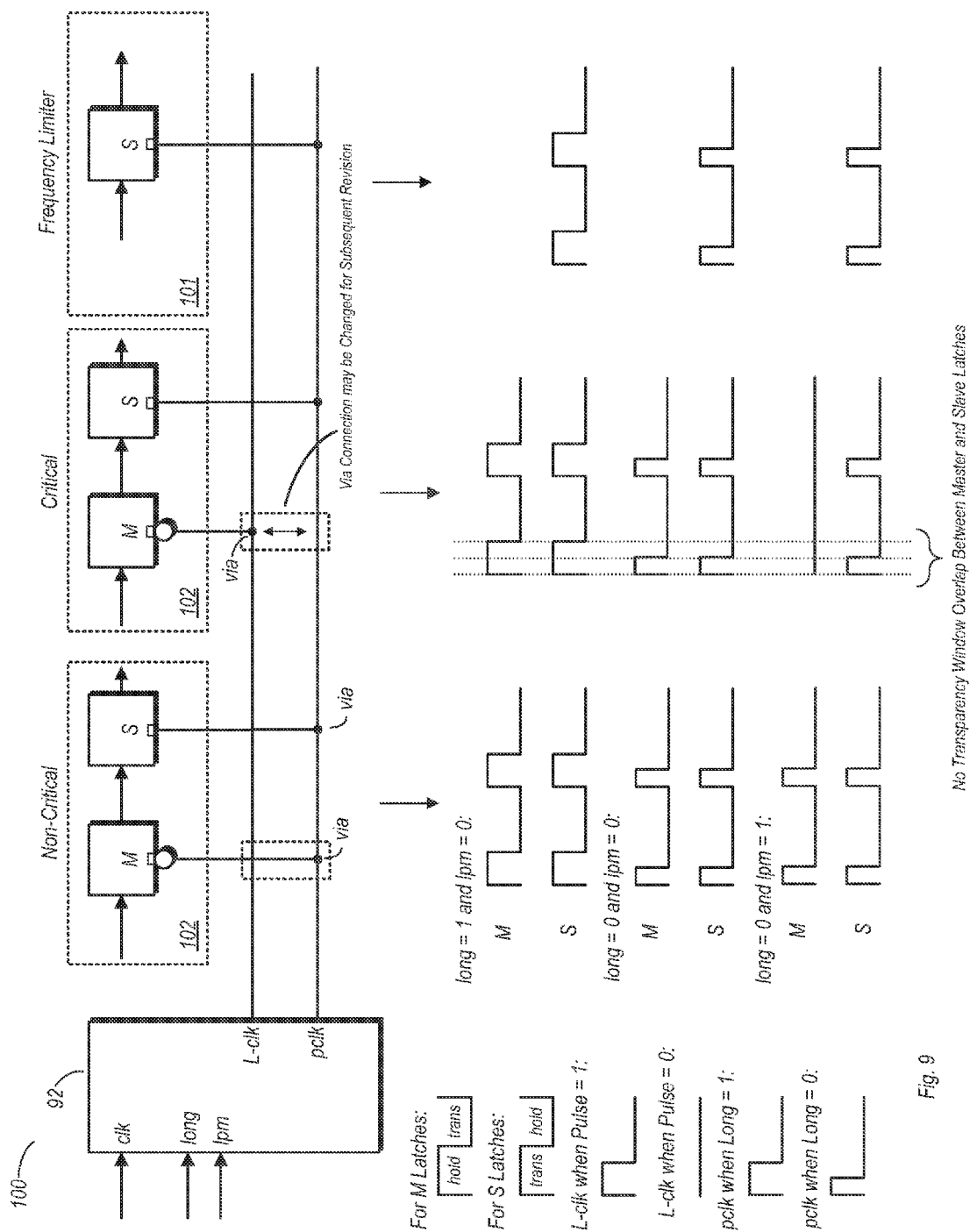
FIG. 9 is a drawing that illustrates timing patterns for different types of flop circuits in one embodiment of an IC.
Figure 10:
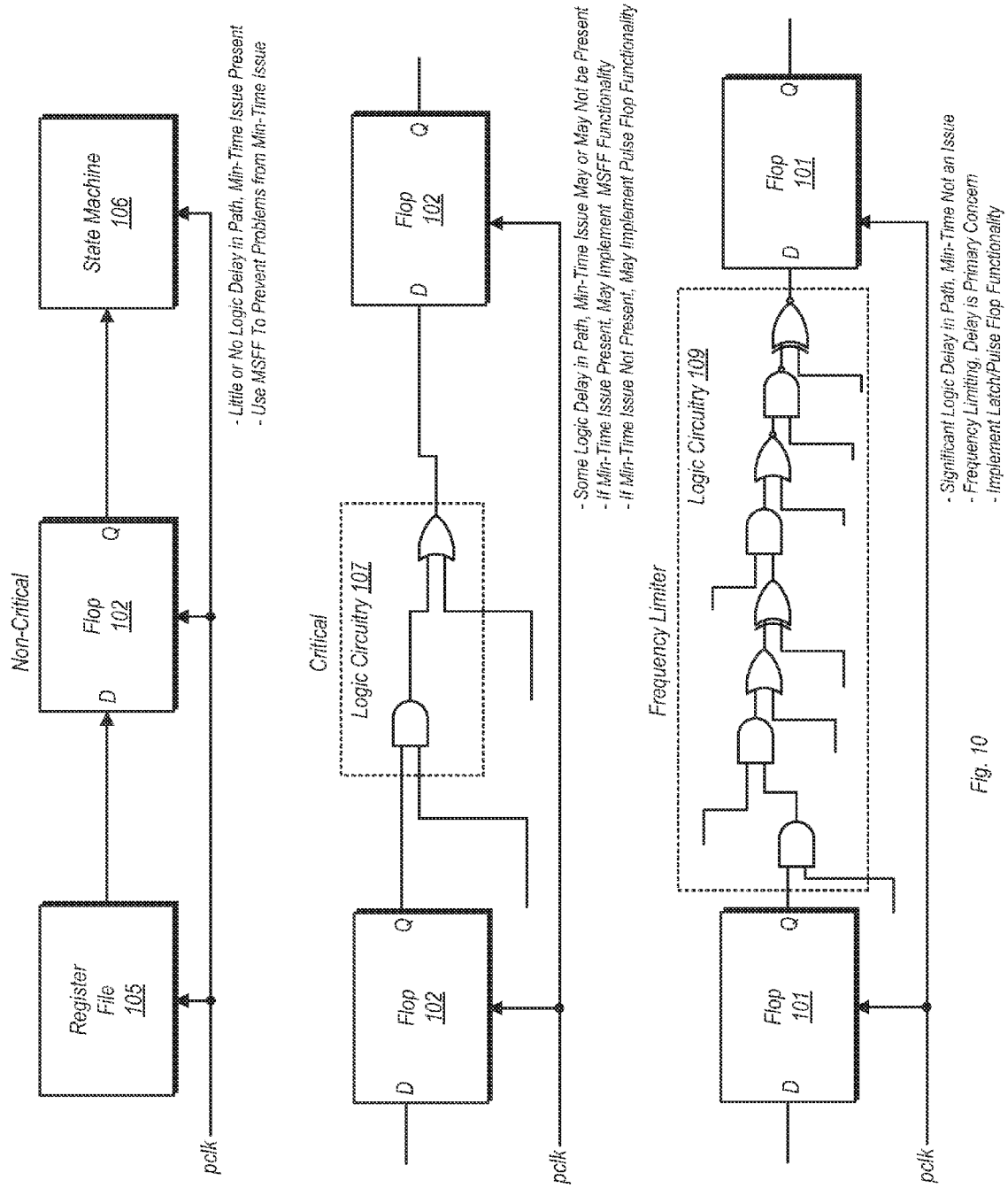
FIG. 10 is a drawing illustrating differences between non-critical flops, critical flops, and frequency-limiting flops in one embodiment of an IC.

FIGS. 9 and 10 illustrate different categories of flop types 101/102 that may be used in one embodiment of an IC. In FIG. 9, IC 100 may include three different flop-types: non-critical, critical, and frequency limiters. Non-critical and critical flops 102 may each be implemented using a master latch ('M') and a slave latch ('S'). Frequency limiter flops 101 may be implemented using a single slave latch ('S').

Each of the latches in flop types 101/102 in the example shown includes a clock input coupled to receive a clock signal. The latches may be transparent responsive to a particular state of the received clock signal. As used herein, the term 'transparent' as applied to a flop circuit may be defined as when a latch circuit is in a state to capture data received on a respective data input and to cause a respective output to respond accordingly. For example, a latch may be considered transparent when a change of a data received on its respective input from a logic 0 to a logic 1 causes a corresponding change (e.g., another logic 0 to logic 1) on its respective data output. It is noted that the latches may be logically inverting, and thus a logic 0 to logic 1 transition on an input may cause a corresponding logic 1 to logic 0 change on the output in such a case. A latch is not transparent as defined herein when it is in a state such that a change of data received on its respective input cannot be reflected on its respective output. Thus, a logic 0 to logic 1 transition on the input of a non-transparent latch does not cause any corresponding change to the output of that latch. The non-transparent state may also be referred to as a hold state.

In this embodiment, each of the master latches of flop type 102 includes a clock input that is responsive to an active low condition (e.g., when the clock is low). Thus, each master latch is configured to be transparent when the clock is low. Conversely, each of the slave latches in this embodiment (on flop types 101 and 102) is configured to be transparent when the clock signal on its respective clock input is high. Thus, for flop types 102, the master and slave latches are transparent for opposite clock signal states.

FIG. 10 provides examples used to illustrate the classification of flop types. The classification of flop types may be based on the arrangement of a particular flop within IC 100, as well as its relation to other flops also implemented in the IC.

Non-critical flops may be those flops for which there is little or no logic delay between two flops or between different state elements in which the flop is an intervening element. In the example used herein to illustrate non-critical flops, flop 102 is implemented between register file 105 and state machine 106. Each of these circuits is coupled to receive a clock signal, pclk, and their respective operations are synchronized thereto. No logic circuitry other than flop 102 is coupled between register file 105 and state machine 106. Accordingly, there is no logic delay between register file 105 and flop 102, nor is there any logic delay between flop 102 and state machine 106.

Transfer of signals between register file 105 and state machine 106 may be intended to proceed in an orderly fashion according to the pclk signal to ensure correct operation of the latter. More particularly, in this particular example, the transfer of a particular signal state between register file 105 and state machine 106 is intended to occur over two separate cycles of the pclk signal. Accordingly, preventing the min-time problem is an important consideration in this situation. If subject to the min-time problem, a race condition may exist wherein a signal state passes through flop 102 during its transparency such that only on cycle of pclk elapses for a signal transfer between register file 105 and state machine 106. Receiving a signal state a cycle ahead of when intended may thus cause state machine 106 to malfunction, which can in turn render the IC in which it is implemented inoperable. Accordingly, a flop 102 designated as non-critical may be implemented as a traditional master-slave flip-flop, wherein the master and slave latches are not concurrently transparent. In such a master-slave flip-flop, the min-time issue is not relevant, as a signal received in accordance with a first cycle of a clock signal may not be transmitted by the same until a second cycle of the clock signal. Thus, returning to the example of a non-critical flop shown in FIG. 10, a requirement of two cycles of the clock signal for the transfer of signals between register file 105 and state machine 106 may be enforced by implementing non-critical flop 102 as a master-slave flip-flop. Various traditional types of master-slave flip-flops may be used to implement non-critical flops 102.

In the case of flops designated as frequency limiters, the min-time issue is not a factor. In the example shown in FIG. 10, two flops 101 are separated by logic circuitry 109. The logic gates of logic circuitry 109 in this example include AND, OR, NAND, NOR, XOR and XNOR gates, with multiple instances of some of these gate types. Accordingly, a significant amount of logic delay is present between the Q output of flop 101 on the left of the drawing and the D input of flop 101 on the right of the drawing.

Due to the amount of logic delay between flops designated as frequency limiters, the primary concern may be delay through the flops themselves. Since signal paths subject to a significant amount of logic delay may be frequency limiting (e.g., may limit the clock frequency at which their respective IC can operate), it is desirable to minimize the delay through flop 101 itself. Accordingly, a flop 101 categorized as a frequency limiter may be implemented as a clocked latch/pulse flop having a single stage. The particular circuit configuration for the flop 101 may be chosen to minimize any switching delays with a goal of increasing the operating frequency of the IC.

One possible implementation of such a circuit may be one similar to pulse flop 50 of FIG. 5, with input circuit 52 removed. Removing input circuit 52 from pulse flop 50 may both minimize the delay from its input to its output while removing its dependence on a second clock signal. Such a circuit may thus be transparent any time pclk is high.

Critical flops may be those flops that fall somewhere in between non-critical flops and frequency limiter flops. Non-critical flops and frequency limiter flops may be identified relatively easily, and thus determining the type of flop to use in these situations may also occur easily. In contrast, non-critical flops in this example are those flops where such a determination cannot be easily made.

In the example shown, logic circuit 107 includes two gates, and thus two logic gate delays, in the path between the two flops 102. Depending on the amount of delay provided by these gates, the min-time problem may or may not be present. If the min-time delay is present, flops identified as critical may be implemented as master-slave flip-flops. If the min-time delay is not present, critical flops may be implemented as pulse flops. Accordingly, the methodology discussed herein may be used to determine which of the critical flops may be implemented as pulse flops and which are to be implemented as master-slave flip-flops.

Returning to FIG. 9, it is noted that each of the master and slave latches of each non-critical flop is coupled to receive the pclk signal. As previously noted, the master latches in this particular example are transparent when the received clock signal is low, while the slave latches are transparent when the received clock signal is high. Accordingly, by coupling both the master and slave latches of the non-critical flops to receive the pclk signal, their transparency windows may be exclusive of one another.

With respect to the critical flops, the master latches thereof are initially coupled to receive a clock signal, L-clk, that is different from the pclk signal received by the respective slave latch. The L-clk signal may be provided as a clock signal similar to the pclk signal when operating in a first mode. Thus, when operating in the first mode, the critical flops may function as master-slave flip-flops. In a second mode of operation, the L-clk signal may be inhibited, and thus clock unit 92 may convey a DC (direct current) signal on its corresponding signal line. The DC signal may be held low in this particular implementation, and thus the master latch of each critical flop may be held transparent. Thus, in the second mode of operation, the critical flops may operate as pulse flops.

For at least an initial version of IC 100, the critical flops may be operated in both the first and second modes in order to aid in determining whether these flops are to be implemented in a subsequent as master-slave flip-flops or pulse flops. Each of the critical flops may be evaluated on an individual basis. This may allow for fine-grain optimization of certain performance and power characteristics of IC 100, as opposed to a methodology where flops must be evaluated on a group basis. Only those flops for which operation as a master-slave flip-flop is to be implemented need be altered between revisions. Furthermore, the alteration may be performed by changing only a single connection.

For those critical flops that are to be implemented as master-slave flip-flops in a subsequent revision of IC 100, their respective master latchs may be reconnected to receive the pclk. This may be accomplished by changing the via connection for the master latch of each critical flop that is to be implemented as a master-slave flip-flop, from a signal line upon which the L-clk signal is conveyed to a signal line upon which the pclk signal is conveyed. To change the via connection, a metal layer of IC 100 may be changed for the subsequent revision.

For those critical flops that are to be implemented as pulse flops in a subsequent revision of IC 100, the connection may remain as originally implemented, with respective master latches coupled to a signal line upon which the L-clk signal was conveyed. During normal operations of IC 100, post-development, operation may occur in the second mode, with the L-clk signal held to a DC level (e.g., low in this example). Thus, the master latch of each critical flop implemented as a pulse flop may remain transparent, while a corresponding slave latch may operate in accordance with the pclk signal.

Various embodiments of the circuits discussed in reference to FIGS. 3-8 may be used to implement critical flops. For example, an embodiment of pulse flop 30 could be used to implement a critical flop by initially connecting the gate terminals of devices P32 and P34 to receive the L-clk signal, while device N33 receives pclk signal. In such an embodiment, input circuit 32 could act as a master latch, while transfer circuit 34 and storage circuit 36 taken in combination act as a slave latch. If evaluation of an individual instance of pulse flop 30 as a critical flop determines that it is desirable that it be implemented as a master-slave flip-flop, respective gate connections of P32 and P34 could be changed for a subsequent revision of IC 100 (by changing a metal layer) to couple them to the signal line of the pclk signal. In such a case, the circuit would be hardened against the min-time problem, since input circuit 32 would be transparent on an opposite phase of pclk than would be the slave latch component of transfer circuit 34. If evaluation of an individual instance of pulse flop 30 determines it is desirable to operate as a pulse flop, the gate terminals of P32 and P34 may remain with their initial connection to the signal line upon which the L-clk signal is conveyed. As previously noted, during normal operation, the signal line for L-clk may be held low during normal operation. Accordingly, if respective gate terminals of P32 and P34 are coupled to the L-clk signal line, input circuit 32 may remain transparent when the L-clk signal line is held low, thus enabling the circuit of FIG. 3 to operate as a pulse flop.

Variations of the circuits shown in FIGS. 5 and 7 may similarly be used to implement the critical flops in an initial version of IC 100. In some cases, an inverter may be required to be provided for a clock input, or some devices may need to be replaced with devices of the opposite polarity (e.g., replacing certain NMOS devices with PMOS devices). Such modifications that enable these circuits to be implemented as critical flops that are easily switched between master-slave flip-flop operation and pulse flop operation, based on the clock connection to a master latch, will be apparent to those skilled in the art.

In order to operate the critical flops in the initial version of IC 100 as master-slave flip-flops while preventing the min-time problem from being an issue, it is important to ensure that the transparency windows of the master and slave latches are not overlapping. In this particular example, this may be accomplished by ensuring that pclk is high only when L-clk is also high. Clock unit 92 may be arranged to ensure this type of clock alignment.

Figure 11:
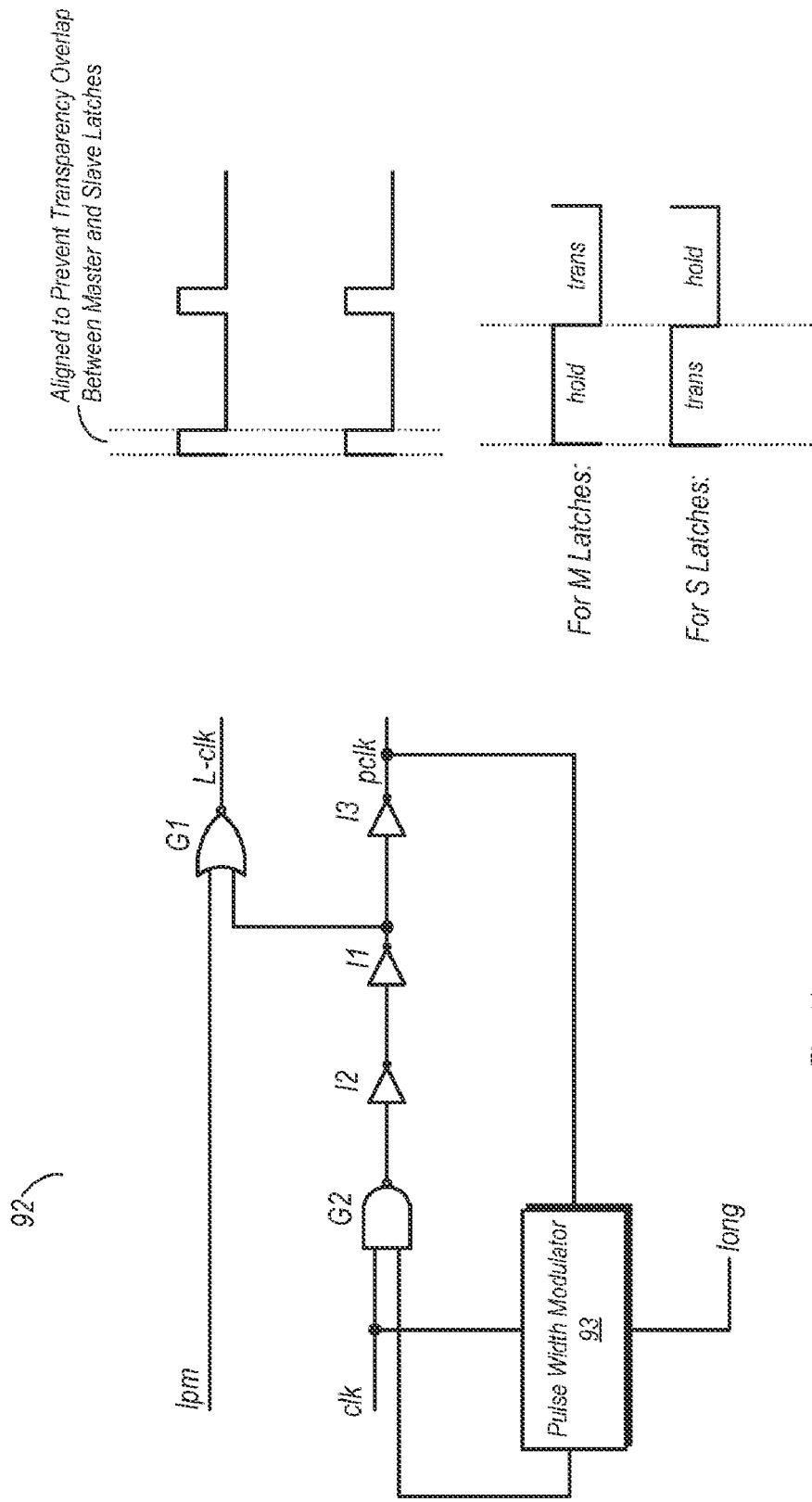
FIG. 11 is a block diagram of one embodiment of a clock unit.

One possible embodiment of clock unit 92 is shown in FIG. 11. In the embodiment shown, clock unit 92 is coupled to receive a single clock signal, clk, and to produce two clock signals, pclk and L-clk. The clk signal may be received by NAND gate G2 in the embodiment shown, which is also coupled to receive an output of pulse width modulator 93. The resultant output of NAND gate G2 in this embodiment may be a pulse having a duty cycle based on the output of pulse width modulator 93. The output of NAND gate G2 may be logically inverted by inverter I2. The output of inverter I2 may be received by both inverter I1, while the output of I1 may be provided as an input to NOR gate G1. The output of NOR gate G1 is provided as the L-clk signal in this example, while the output of inverter I1 is also provided to inverter I3, which in turn provides the pclk signal. Since both of these signals are produced based on the output of inverter I1 and both are subject to approximately the same gate delay, their rising and falling edges may thus be substantially aligned. Since the master and slave latches in the embodiments discussed herein are transparent on opposite clock phases (high for slave latches, low for master latches), their respective transparency windows are not overlapping.

Operation in a selected one of the first and second modes may be controlled by clock unit 92. In the embodiment shown, clock unit 92 is coupled to receive a low power mode signal, lpm. More particularly, the lpm signal may be received by one input of NOR gate G1 in this particular embodiment. Operation in the first mode may occur when the lpm signal is low. When the lpm signal is low, the output of NOR gate G2 may depend on the output of inverter I2, and thus L-clk may be a pulse. When the L-clk signal is a pulse, critical flops having the separate clock connections for master and slave latches as shown in FIG. 9 may operate in the first mode, as master-slave flip-flops. When the lpm signal is high, the output of NOR gate G2 may be held low, and thus L-clk is a DC low level. When the L-clk signal is a DC low level, critical flops having clock connections as shown in FIG. 9 may operated in the second mode, as pulse flops.

As shown in FIG. 9, the pulse width of the clock signals produced by clock unit 92 may be varied. In this particular embodiment, the variation may involve one of two pulse widths. More particularly, the pulse width may be varied according to the 'long' signal, which may be received by pulse width modulator 93. When the long signal is asserted (e.g., a logic 1 in this embodiment), the resultant pulse width of pclk and L-clk may be greater than when the long signal is not asserted (e.g., a logic 0). Embodiments of a clock unit 92 having a greater number of variations (e.g., 4) of the pulse width than illustrated here are possible and contemplated, and thus the long input may include two or more separate signals.

Pulse width modulator 93 in the embodiment shown may be any type of circuitry that may be used to vary the pulse width of an output clock pulse. In this example, pulse width modulator is coupled to receive the pclk signal and may produce a corresponding output signal (provided as an input to NAND gate G2) based on pclk and the state of the long signal. Pulse width modulator 93 may be implemented using a phase locked loop (PLL), a delay locked loop (DLL), or a state machine that can cause the pulse width of pclk to be varied. In general, clock unit 92 may be implemented using any type of clock circuitry that can be used to output two separate clock signals that are aligned with each other in such a manner that the master and slave latches of the critical flops shown in FIG. 9 are not concurrently transparent.

It is noted that in this embodiment, both of the clock signals produced are pulse clock signals having less than a 50% duty cycle. However embodiments of a clock unit wherein at least one of the clock signals (e.g., L-clk) is a clock signal having a 50% duty cycle. In such a case, the alignment between the two clock signals may still be arranged such that master and slave latches of critical flops as shown in FIG. 9 are not concurrently transparent, thus enabling master-slave flip-flop operation.

Figure 12:
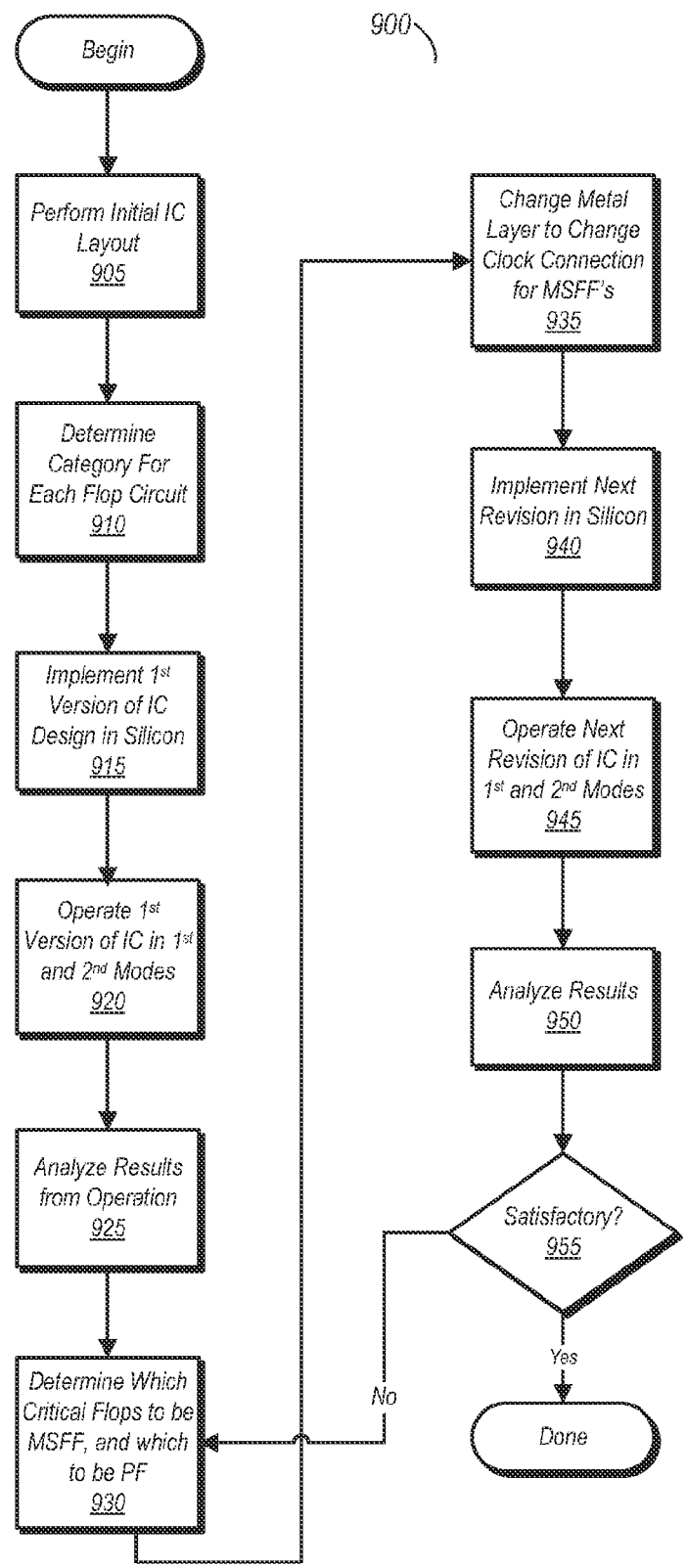
FIG. 12 is a flow diagram of one embodiment of performing flop selection on a flop-by-flop basis in the evaluation and revision phase during the development of an IC.

FIG. 12 is a flow diagram of one embodiment of performing flop selection on a flop-by-flop basis in the evaluation and revision phase during the development of an IC. The method used herein may be performed for one or more iterations to determine which critical flops are to be implemented as master-slave flip-flops, and which are to be implemented as pulse flops.

Method 900 begins with the performing an initial layout of the IC design (block 905). The initial layout may include determining locations and interconnections of the devices making up the various combinational and/or sequential logic circuits of the IC. The layout may be performed using various design tools, and may generate initial versions of files such as GDS (Graphical Database System) II files.

The layout process discussed above may also include determining where flops are to be placed in the IC layout in order to provide clocked data paths between two or more functional blocks. After determining where the flops are to be implemented, the flops may be categorized as non-critical, critical, or frequency limiters (block 910), and may be connected as shown in FIG. 9 to complete the initial layout process.

The non-critical flops may be those placed in data paths having little or no logic delay, thus making them potentially vulnerable to the min-time problem. Accordingly, non-critical flops may be implemented as master-slave flip-flops. The master-slave flip-flops may be designed such that their respective master and slave latches are not concurrently transparent. Since respective master and slave latches are not concurrently transparent, such master-slave flip-flops may be hardened against the min-time issue.

The frequency limiters may be those flops placed in data paths having a significant logic delay, with virtually no vulnerability to the min-time problem. In such paths, delay through the flop is a primary consideration, with power savings being an additional consideration. Minimizing the delay and power consumption of such flops may enable higher operating frequencies than would otherwise be possible if master-slave flip-flops were used in such instances. Accordingly, frequency limiters may be implemented using pulse flops having a single stage.

Classification of certain flops as non-critical or frequency limiters may be a relatively straightforward process. Such classification may be performed with a high degree of confidence that the chosen flop type is appropriate for the particular data path, and that no further changes to the flop type will be required. In contrast, critical flops are those flops in which it is not a straightforward process to determine whether a particular flop should be a master-slave flip-flop or a pulse flop. Since critical flops are implemented in data paths that have some logic delay, but less than those categorized as frequency limiters, determining whether the min-time problem is an issue may require additional testing. Accordingly, as noted above, flops designated as critical flops may be initially connected as shown in FIG. 9, with respective master and slave latches coupled to receive different clock signals.

After the classification of each of the flop types and completion of the layout process, an initial version of the IC may be implemented in silicon (block 915). It is noted that while silicon is used as an example here, other materials may be used, including those materials used to dope the silicon to create the NMOS and PMOS devices. Other materials that may be used include graphene, gallium arsenide, or any other material suitable for implementing an IC.

Once the initial version of the IC is implemented, it may be tested to ensure correct operation. Such testing may include operating the initial version of the IC in first and second modes of operation (block 920). Operating in the first mode may include operating the critical flops as master-slave flip-flops by cycling both the pclk and L-clk signals as discussed above. Operating in the second mode may include holding the L-clock signal to a DC level (e.g., a DC low level) while cycling the pclk signal. In the second mode of operation, the master latches of each critical flop may remain transparent, causing these flops to operate as pulse flops. Operation in these modes may be performed at various frequencies and various pulse widths to fully exercise the IC.

After testing of the initial version has concluded, the results of operation in the first and second modes may be analyzed (block 925). Such analysis may include identifying the occurrence of any erroneous operation associated with critical flops in either of the first and second modes. Analysis may be conducted on an individual, flop-by-flop basis. Based on the analysis of operation in the first and second modes, at least some of the critical flops may be designated for a future revision of the IC either as master-slave flip-flops or as pulse-flops (block 930). For example, critical flops that, when operated in the second mode, caused erroneous operation due to a min-time problem at all frequencies may be designated as master-slave flip-flops for the next revision of the IC. In contrast, critical flops that caused no erroneous operation when operated at any frequency in the second mode may be designated as pulse flops for the subsequent revision of the IC. Critical flops that prevented the IC from meeting frequency targets when operated in the first mode, but otherwise caused no erroneous operation in the second mode, may be designated as pulse flops for the next revision of the IC.

It is noted that not all critical flops may be designated as master-slave flip-flops or pulse flops after testing the initial version of the IC. In some cases, making such a determination for each critical flop may require several iterations, as erroneous operation of some critical flops may cause the same in other critical flops that might otherwise operate as intended in both modes. Accordingly, an iterative process may aid in making this determination for each individual flop designated as critical.

After at least some of the critical flops have been designated as master-slave flip-flops, a metal layer may be altered for the next revision of the IC (block 935). Altering the metal layer may include changing a GDS II file that by manufacturing equipment in fabricating the chip. The alteration to the metal layer may disconnect a master latch of a critical flop from the signal line upon which L-clk is conveyed, and subsequently connect it to a signal line upon which pclk is conveyed. This via change thus causes the master and slave latches of a changed critical flop to receive the pclk signal, with the master latch being responsive to the opposite phase as the slave latch.

After completion of the metal layer change, a subsequent revision of the IC may be implemented in silicon (block 940). The next revision may be operated in the first and second modes as discussed above (block 940). Operating the next revision of the IC in the first and second modes may allow for verification of the changes to certain critical flops made by changing the metal layer and may help locate additional critical flops that cause erroneous operation or failure to meet performance targets in one of the operational modes.

Once the operation per block 945 is complete, the results may be analyzed again (block 950). Analysis of the results obtained during operation may be performed. If it is determined that the current revision of the IC performed satisfactorily, meeting all performance targets and operational specifications, then the flop selection process may be complete (block 955, yes). If the performance is unsatisfactory for any reason (block 955, no), or some critical flops have yet to be designated then the method may return to block 930 and another iteration may be performed. Iterations may be performed until designations have been made for all flops previously designated as critical flops. As previously noted, the designation of critical flops as either a master-slave flip-flop or a pulse flop may be performed on an individual basis, thereby allowing for maximum granularity in flop selection for the IC design. This in turn may help optimize the performance of the IC design and its power consumption.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method comprising:
operating a plurality of flop circuits of an integrated circuit (IC) in a first mode, each of the plurality of flop circuits having a master latch and a slave latch, wherein operating in the first mode includes, for each of the plurality of flop circuits, the master latch being transparent in accordance with a first clock signal and the slave latch being transparent in accordance with a second clock signal, and wherein the master latch and slave latch are not concurrently transparent;

operating each of the plurality of flop circuits in a second mode, wherein in operating in the second mode includes, for each of the plurality of flop circuits, holding the master latch transparent and wherein the slave latch is transparent in accordance with the second clock signal; and determining, based on said operating in the first mode and the second mode, which of the plurality of flops is to operate as a master-slave flip-flop and which flops are to operate as pulse flops for a subsequent revision of the IC.

2. The method as recited in claim 1, further comprising determining a first one of the plurality of flops is to operate as a master-slave flip-flop in the subsequent revision of the IC, and that a second one of the plurality of flops is to operate as a pulse flop in the subsequent revision of the IC.

3. The method as recited in claim 2, further comprising, for the subsequent revision of the IC, arranging a clock input of the master latch of the first one of the plurality of flops to receive the second clock signal.

4. The method as recited in claim 3, further comprising arranging the master latch of the first one of the plurality of flops to be transparent during a first phase of the second clock signal and further comprising arranging the slave latch to be transparent during a second phase of the clock signal, wherein the second phase is opposite of the first phase.

5. The method as recited in claim 1, further comprising determining that each of a first subset of the plurality of flops is to operate as a master-slave flip-flop, and that each of a second subset of the plurality of flops is to operate as a pulse flop, and wherein said determining is performed individually for each flop.

6. The method as recited in claim 1, wherein, when operating in the first mode, the first clock signal and the second clock signal are pulse clock signals each having less than a 50% duty cycle.

7. The method as recited in claim 1, wherein, when operating in the second mode, a direct current signal is provided in place of the first clock signal, and wherein the second clock signal is a pulse clock having less than a 50% duty cycle.

8. The method as recited in claim 7, further comprising providing the second clock signal at a first pulse width responsive to a signal received by a clock unit being in a first state, and providing the second clock signal at a second pulse width less than the first pulse width responsive to the signal being in a second state.

9. An integrated circuit comprising:
a clock unit configured to convey a first clock signal on a first signal path during a first mode of operation and further configured to convey a (direct current) signal on the first signal path during a second mode of operations, wherein the clock unit is further configured to convey a second clock signal on a second signal path during each of the first and second modes of operation; and a first plurality of flop circuits each including a master stage and a slave stage, wherein the master stage of each of the first plurality of flop circuits includes a first clock input coupled to the first signal path, and wherein the slave stage of each of the first plurality of flop circuits includes a second clock input coupled to the second signal path; wherein each of the first plurality of flop circuits is configured to operate as a master-slave flip-flop when in the first mode of operation, and wherein each of the first plurality of flop circuits is configured to operate as a pulse flop circuit when in the second mode of operation.

10. The integrated circuit as recited in claim 9, wherein the clock unit is configured to align the first and second clock signals such that the master stage and slave stage of each of the first plurality of flop circuits are not concurrently transparent when operating in the first mode.

11. The integrated circuit as recited in claim 9, wherein the clock unit is further configured to vary a pulse width of the second clock signal depending on a state of a first signal, and wherein the clock unit is further configured to select one of the first or second operating modes dependent on a state of a second signal.

12. The integrated circuit as recited in claim 9, wherein the integrated circuit further includes a second plurality of flop circuits, wherein each of the second plurality of flop circuits includes a first stage configured to act as a master latch and a second stage configured to act as a slave latch in a master-slave flip-flop configuration, wherein respective clock inputs of the first and second stages are each coupled to receive the second clock signal, and wherein the first and second stages of the second plurality of flop circuits are configured such that they are not concurrently transparent with each other.

13. The integrated circuit as recited in claim 12, further comprising a third plurality of flop circuits, wherein each of the third plurality of flop circuits is a single stage pulse flop.

14. A method comprising:
performing a layout of an integrated circuit (IC) design, wherein performing the layout includes arranging a master latch of each of a plurality of flops to receive a first clock signal and arranging a slave latch of each of the plurality of flops to receive a second clock signal;

implementing the IC design;

operating the IC in a first mode in which the master latch of each of the plurality of flops is transparent responsive to the first clock signal and wherein the slave latch of each of the plurality of flops is transparent responsive to the second clock signal;

operating the IC in a second mode in which the master latch of each of the plurality of flops is held transparent, and wherein the slave latch of each of the plurality of flops is transparent responsive to the second clock signal;

determining, based on said operating in the first mode and the second mode, which of the plurality of flops is to operate as a master-slave flip-flop and which flops are to operate as pulse flops for a subsequent revision of the IC.

15. The method as recited in claim 14, wherein said determining which of the plurality of flops are to operate as master-slave flip-flops and which are to operate as pulse-flops is performed individually for each of the plurality of flops.

16. The method as recited in claim 14, wherein said determining includes determining which of the plurality of flops caused erroneous operation of the IC during operations in the second mode.

17. The method as recited in claim 14, further comprising arranging a selected one of the plurality of flops to operate as a master-slave flip-flop in the subsequent revision, wherein said arranging comprises revising clock connection for a selected one of the plurality of flops for the subsequent revision, wherein said revising the clock connection comprises:

disconnecting a clock input of the master latch of a selected one of the plurality of flops from a first signal path coupled to convey the first clock signal; and connecting the clock input of the master latch of the selected one of the plurality of flops to a second signal path coupled to convey the second clock signal.

18. The method as recited in claim 17, wherein said disconnecting and said connecting comprise changing a metal layer such that the clock input of the master latch of the selected one of the plurality of flops is coupled to the second signal path for the subsequent revision.

19. The method as recited in claim 14, further comprising arranging a selected one of the plurality of flops to operate as a pulse flop in the subsequent revision, wherein said arranging comprises:
 leaving clock connections of the master and slave latches of the selected one of the plurality of flops unchanged for the subsequent revision; and operating the subsequent revision of the IC in the second mode, wherein the master latch of the selected one of the plurality of flops remains transparent during operations in the second mode.

20. The method as recited in claim 14, second clock signal is a pulse having a duty cycle that is less than 50%, and wherein operating in each of the first and second modes includes:
 operating with the second clock signal provided at a first pulse width; and
 subsequently operating with the second clock signal provided at a second pulse width different from the first pulse width.

* * * * *

UNITED STATES PATENT AND TRADEMARK OFFICE
CERTIFICATE OF CORRECTION

PATENT NO. : 8,305,126 B2
APPLICATION NO. : 13/005835
DATED : November 6, 2012
INVENTOR(S) : Smith et al.

Page 1 of 1

It is certified that error appears in the above-identified patent and that said Letters Patent is hereby corrected as shown below:

In column 5, line 54, delete "thereof" and insert -- thereof. --, therefor.

In column 12, line 43, delete "latchs" and insert -- latches --, therefor.

Signed and Sealed this
Fifth Day of February, 2013

Teresa Stanek Rea
*Acting Director of the United States Patent and Trademark Office*